United States Patent [19]

Lauchner et al.

[11] Patent Number: 4,614,878
[45] Date of Patent: Sep. 30, 1986

[54] PULSE GENERATOR

[75] Inventors: John K. Lauchner, Tempe; Michael S. Christensen, Mesa; Paul J. Alonge, Chandler, all of Ariz.

[73] Assignee: Motorola, Inc., Schaumburg, Ill.

[21] Appl. No.: 700,787

[22] Filed: Feb. 11, 1985

[51] Int. Cl.⁴ .............................................. H03K 1/00
[52] U.S. Cl. .................................. 307/106; 307/107; 307/108; 307/268; 307/265; 328/67
[58] Field of Search ............ 307/106, 107, 108, 265, 307/268, 414, 415, 416, 417, 419; 330/47, 48; 332/5; 331/157, 154; 328/230, 67; 333/13, 14, 19, 20, 23, 138–140

[56] References Cited

U.S. PATENT DOCUMENTS

| | | | |
|---|---|---|---|
| 2,694,149 | 11/1954 | Gross | 307/108 X |
| 2,748,283 | 5/1956 | Merrill et al. | 307/107 X |
| 2,942,191 | 6/1960 | Welty | 307/106 X |
| 3,139,585 | 6/1964 | Ross et al. | 328/65 |
| 3,185,928 | 5/1965 | Coyle | 328/67 X |
| 3,207,994 | 9/1965 | Theodore et al. | 328/67 |
| 3,337,755 | 8/1967 | Grabowski et al. | 307/106 |
| 3,479,532 | 11/1969 | Kennedy | 328/67 X |
| 3,578,986 | 5/1971 | McGuffin | 328/67 X |
| 3,708,697 | 1/1973 | Georgopoulos | 307/268 X |
| 3,772,601 | 11/1973 | Smith | 328/65 |
| 3,772,613 | 11/1973 | Smith | 328/65 X |
| 4,087,705 | 5/1978 | Barnes | 328/67 X |
| 4,099,128 | 7/1978 | Hooper | 328/67 X |
| 4,250,410 | 2/1981 | Moench et al. | 307/268 X |
| 4,274,134 | 6/1981 | Johannessen | 307/106 X |
| 4,388,536 | 6/1983 | Peil et al. | 307/268 |

Primary Examiner—William M. Shoop, Jr.
Assistant Examiner—Shik Luen Paul
Attorney, Agent, or Firm—Raymond J. Warren

[57] ABSTRACT

An apparatus and method is disclosed that produces a high powered sub-microsecond pulse. The present invention utilizes a set of parallel high speed switches and drivers to switch a Darlington Pulse forming network that is charged by a resonant charging circuit. The Darlington Pulse forming network produces a negative pulse which is inverted in a coaxial inverter and then amplified in a coaxial line transformer to provide the high powered short duration pulse signal.

27 Claims, 4 Drawing Figures

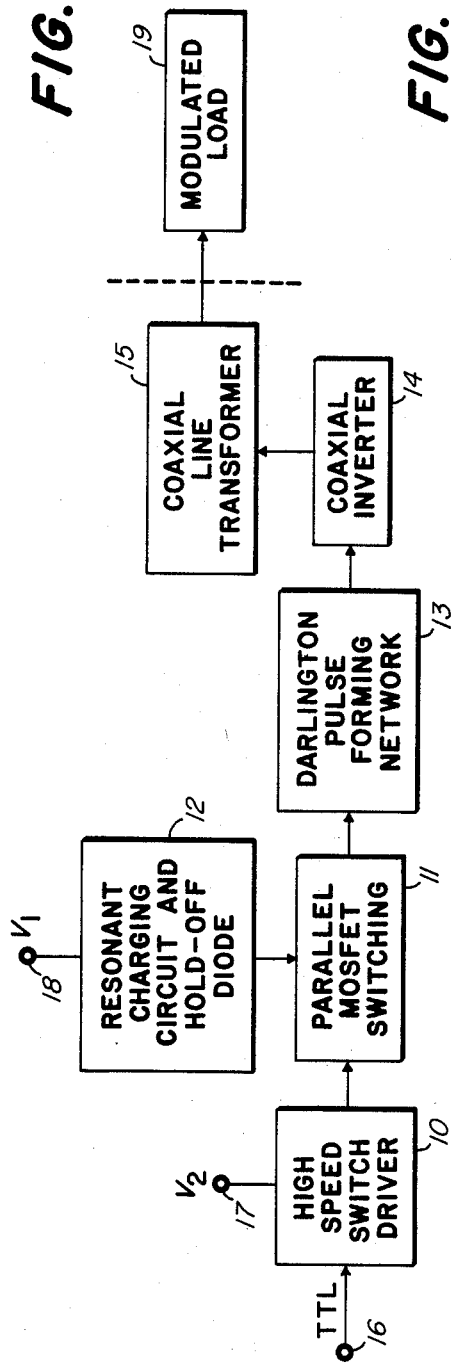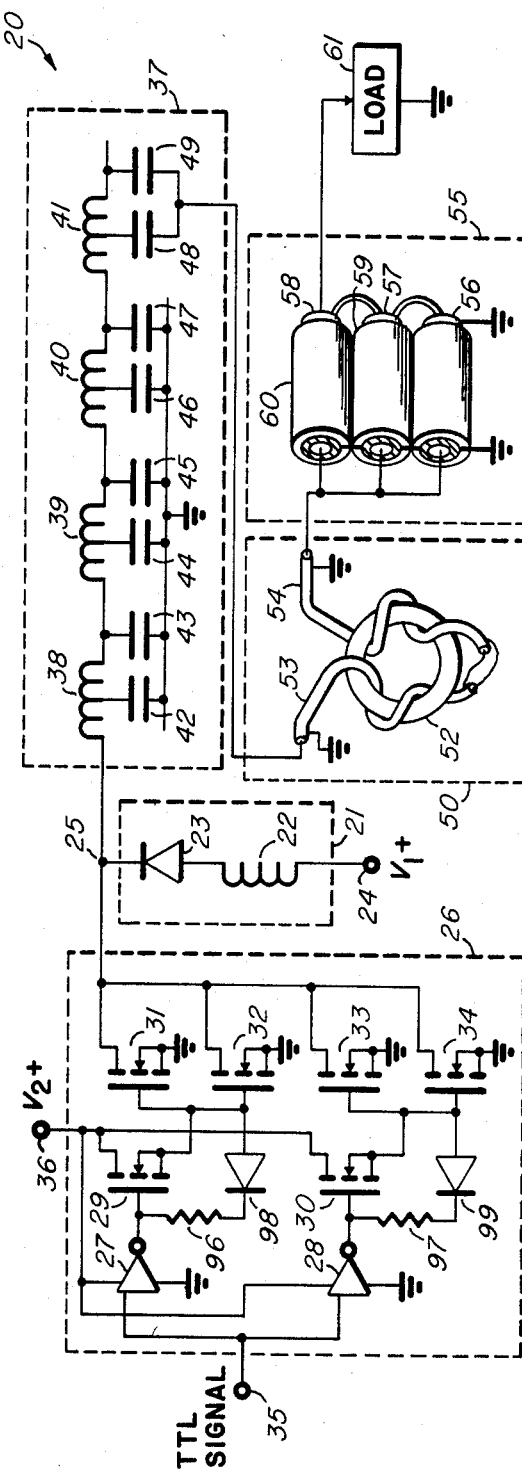

PULSE GENERATOR

BACKGROUND OF THE INVENTION

1. Field of the Invention

This invention relates, in general, to pulse generators and, more particularly, to high powered sub-microsecond pulse generators for driving high pulse power loads such as magnetrons and traveling wave tubes.

2. Description of the Background

Prior to the development of the present invention, magnetic modulators using pedestal wave forms were utilized. These magnetic modulators create a pedestal type voltage. A pulse voltage is then superimposed on the pedestal. This type of configuration has numerous drawbacks which include: wasting energy from having to create a pedestal; utilizing saturating inductors, which have poor tolerance levels; having slow rise rates; and not being adjustable to the magnetrons rate of rise requirement through the Hartree region.

SUMMARY OF THE INVENTION

Accordingly, it is an object of the present invention to provide a pulse generator and method of operation that will overcome the deficiencies of the prior art.

A further object of the present invention is to provide a pulse generator and method of operation that does not require the use of a pedestal.

Still another object of the present invention is to provide a pulse generator and method of operation that has an improved rate of rise.

Yet another object of the present invention is to provide a pulse generator that is self adjusting to a magnetron's rate of rise required through the Hartree region.

Yet another object of the present invention is to provide a pulse generator having a reduced power supply requirement.

Yet another object of the present invention is to provide a pulse generator and method of operation that will have more efficient energy usage.

Yet another object of the present invention is to provide a pulse generator and method of operation that is more economical.

Yet another object of the present invention is to provide a pulse generator that provides back-up through redundancy.

Yet another object of the present invention is to provide a pulse generator and method of operation having increased pulse repetition frequency capability.

Yet another object of the present invention is to provide a pulse generator and method of operation having an adjustable pulse repetition frequency.

The above and other objects and advantages of the present invention are provided by an apparatus and method of utilizing a coaxial line transformers to provide a high power sub-microsecond duration pulse.

A particular embodiment of the present invention utilizes a set of parallel high speed switches and generators to switch a Darlington pulse forming network that is charged by a resonant charging circuit. The Darlington pulse forming network produces a negative voltage pulse which maybe inverted in a coaxial inverter and is amplified in a coaxial line transformer to produce a high power pulse signal.

BRIEF DESCRIPTION OF THE DRAWINGS

FIG. 1 is a block diagram of a high powered sub-microsecond pulse generator embodying the present invention;

FIG. 2 is a schematic diagram of a high powered sub-microsecond pulse generator embodying the present invention;

DETAILED DESCRIPTION OF THE DRAWINGS

Figure 3:
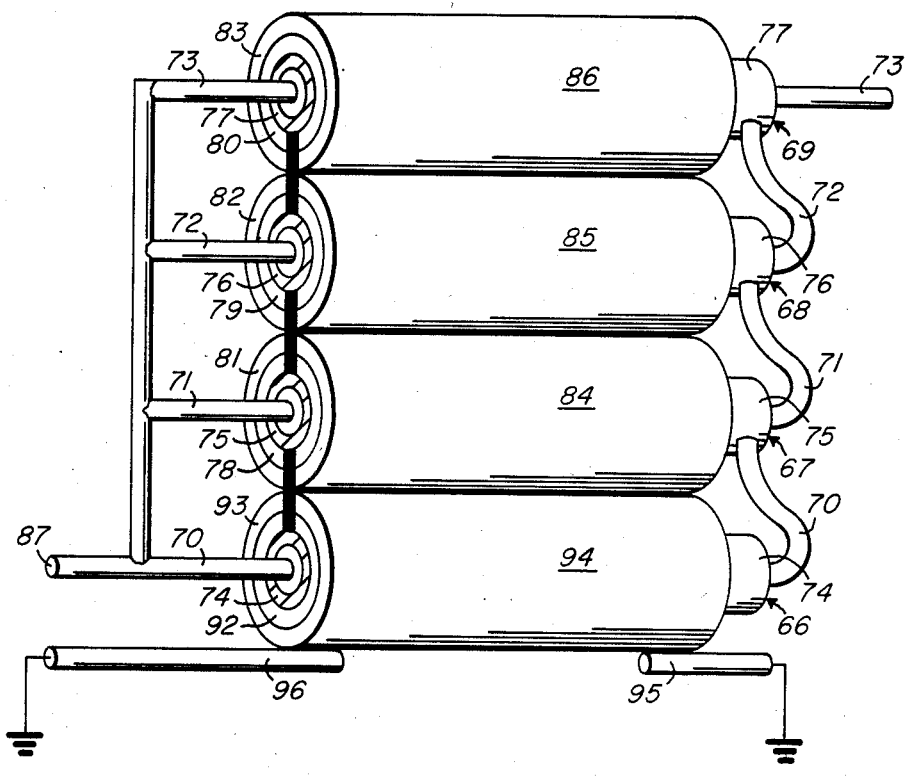
FIG. 3 is a diagram of a prior art coaxial line transformer utilized by the present invention.

Referring to FIG. 1, a block diagram of a high powered sub-microsecond pulse generator embodying the present invention is illustrated. The generator consists of a high speed switch driver 10, a parallel MOSFET (Metal Oxide Semiconductor Field Effect Transistor) switch device 11, a resonant charging circuit and hold-off diode 12, a Darlington pulse forming network 13, a coaxial inverter 14, and a coaxial line transformer 15.

A TTL (Transistor-Transistor Logic) signal enters the generator at a node 16 and is transmitted to high speed switch/driver 10, which is provided with a voltage source, $V_2$, at a node 17. The output of switch/driver 10 is next transmitted to MOSFETs 11. A voltage source, $V_1$, is provided at a node 18, which is coupled to charging circuit 12. The output of charging circuit 12 is coupled to MOSFETs 11. The MOSFETs 11 provide a step signal to Darlington 13. Darlington 13 outputs an inverted voltage pulse to coaxial inverter 14 which outputs a voltage pulse to coaxial line transformer 15. Coaxial transformer 15 increases the amplitude of the voltage pulse and outputs it to a load 19. These steps will be discussed in more detail in conjunction with FIG. 2 below.

If a negative pulse is desired coaxial inverter 14 may be eliminated from the circuit in FIG. 1. In addition, coaxial inverter 14 and coaxial line transformer 15 may be replaced by a coaxial line inverter/transformer which will be discussed further in conjunction with FIG. 4.

Referring now to FIG. 2, a schematic diagram, generally designated 20, of a high powered sub-microsecond pulse generator embodying the present invention is illustrated.

Generator 20 consists of a resonant charging circuit. Circuit 21 consists of an inductor 22 and a hold-off diode 23. Inductor 22 is coupled to a voltage source, $V_1+$, at a node 24 on one end and to the anode of diode 23 on the other end. The cathode of diode 23 is coupled to a node 25.

Generator 20 further consists of a switch/driving circuit 26, which has a pair of driver/inverters 27 and 28; a first set of MOSFETs 29 and 30; a pair of resistors 96 and 97; a pair of diodes 98 and 99; and a second set of MOSFETs 31–34.

Driver/inverters 27 and 28 each have a first reference line coupled to ground; a second reference line coupled to a voltage source, $V_2+$, at a node 36; and an input coupled to a TTL input node 35.

The output of driver/inverter 27 is coupled to the gate of MOSFET 29. The drain of MOSFET 29 is couple to voltage source $V_2+$ at a node 36. The output of driver/inverter 28 is coupled to the gate of MOSFET 30. The drain of MOSFET 30 is coupled to node 36.

The source of MOSFET 29 is coupled to the gates of MOSFETs 31 and 32; and, through diode 98 and resistor 96, to the gate of MOSFET 29. Diode 98 and resistor 96 are provided to discharge the charge built up on the gates of MOSFET 31 and 32. This is required or the gates of MOSFET 31 and 32 would remain high after being charged. The source of MOSFET 30 is coupled to the gates of MOSFETs 33 and 34; and, through diode 99 and resistor 97, to the gate of MOSFET 30. Diode 99 and resistor 97 serve the same function as diode 98 and resistor 96 discussed above.

The sources of MOSFETs 31-34 are coupled to ground and the drains are coupled to node 25. It should be noted here that the four MOSFETs 31-34 may be reduced to two MOSFETs or increased to more than four. This will be discussed further below.

Generator 20 further contains Darlington (or pulse forming) Circuit 37, which consists of inductors 38-41 and capacitor 42-49. The first connector of inductor 38 is coupled to node 25 and the second connector is coupled to the first connector of inductor 39. The first connector of inductor 40 is coupled to the second connector of inductor 39 and a second connector of inductor 40 is coupled to the first connector of inductor 41. Capacitor 42 has one connector tapped into inductor 38 and the second connector coupled to ground. Capacitor 43 has one connector coupled to the second connector of inductor 38 and the second connector coupled to ground. Capacitor 44 has one connector tapped into inductor 39 and the second connector coupled to ground. Capacitor 45 has one connector coupled to the second connector of inductor 39 and the second connector coupled to ground. Capacitor 46 has one connector tapped into inductor 40 and the second connector coupled to ground. Capacitor 47 has one connector coupled to the second connector of inductor 40 and the second connector coupled to ground. Capacitor 48 has one connector tapped into inductor 41 and a second connector coupled to the output of Darlington 37. Capacitor 49 has one connector coupled to the second connector of inductor 41 and the second connector coupled to the output of Darlington 37.

The output of Darlington 37 is coupled to the input of a coaxial inverter 50. Coaxial inverter 50 consists of a ring 52 which has two pieces of coaxial wire 53 and 54 wrapped about ring 52. The output of Darlington 37 is coupled to the inner conductor of a first end of coaxial wire 53 with the outer conductor being coupled to ground. The second end of coaxial wire 53 is coupled to the first end of coaxial wire 54 by coupling the inner conductor of wire 53 to the outer conductor of wire 54; and by coupling the outer conductor of wire 53 to the inner conductor of wire 54. The second end of wire 54 has the inner conductor coupled to the output of coaxial inverter 50 and the outer connector coupled to ground. The output of coaxial inverter 50 is coupled to the input of coaxial transformer 55. If a negative voltage pulse is desired, coaxial inverter 50 can be eliminated and the output of Darlington 33 can be coupled directly to coaxial transformer 55.

Coaxial transformer 55 is illustrated here containing three pieces of coaxial wire 56-58. Coaxial wires 57 and 58 are wrapped with electrical insulating covers 59 and 60, respectively. Wire 56 may also be provided with a protective covering but this is not necessary. The input of transformer 55 is coupled to the first ends of inner conductors 56-58. The outer conductors of the first ends of wires 56-58 are all coupled to ground. At the second end of wire 56 the outer conductor is coupled to ground and the inner conductor is coupled to the outer conductor of the second end of wire 57. The inner conductor of the second end of wire 57 is coupled to the outer conductor of the second end of wire 58. The inner conductor of the second end of wire 58 is coupled to the output of transformer 55. The output of transformer 55 is then coupled to a load 61.

Inductor 22 is used to resonantly charge capacitors 42-49. When the voltage at node 25 reaches a peak value, diode 23 prevents the voltage from dropping. This technique is well-known in the art and can provide a voltage at node 25 greater than at node 24.

When a TTL signal is applied at node 35, MOSFETs 31-34 cause node 25 to be shorted to ground causing the voltage to drop. In this particular embodiment MOSFETs were utilized because of their speed and high power. It should be noted that other devices may be used to satisfy other power and/or speed requirements. If more power is desired, more MOSFETs may be used by adding one or more amplifier/inverters and three MOSFETs per amplifier/inverter. Should some type of damage occur to one of the sets of amplifiers/inverters and MOSFETs, the others would pick-up the slack and provide the same power as previously provide by the entire set. This redundancy of parts has two functions: first, it allows a back-up if something should occur to one line of circuits; and second, it allows the circuits to operate at a level well below their power rating. It should be noted here that only two MOSFETs in series need be provided for each driver/inverter if this meets the desired power requirement.

The step function voltage that is transmitted to the input of Darlington 37 is transformed to a negative pulse voltage at the output. This is the result of the signal being reflected and added to the original signal. As the operation of Darlington Pulse forming networks are well-known in the art, this will not be discussed in detail here. It is sufficient for the purposes of this invention to note that Darlington 37 can be set to provide a voltage pulse having a predetermined width. In addition, the present embodiment illustrates Darlington 37 having four units, N. The voltage pulse height at the output of Darlington 37 is the peak voltage of its input times N/2. Therefore, the present circuit provides a voltage pulse having magnitude two times the height of the input voltage. If six units were used in Darlington 37, the pulse voltage magnitude at the output would be three times that of the voltage input. This then provides a pulse that is adjustable as to voltage magnitude and width.

The inverted voltage pulse from Darlington 37 is then transmitted to coaxial inverter 50 which provides a positive voltage pulse having unity gain. In coaxial inverter 50, coaxial lines 53 and 54 are wrapped around a ring 52 made of ferrite. Ferrite ring 52 makes lines 53 and 54 look longer which enables a shorter length of coaxial line to be used. The characteristic impedance of inverter 50 is set to match that of Darlington 37 and transformer 55 through the selection of the coaxial cable used.

The output of inverter 50 is next transferred to transformer 55, which will be discussed in more detail in conjunction with FIG. 3 below, where the voltage pulse is amplified. This signal is then transmitted to load 61.

As illustrated here the present invention does not utilize saturating inductors as required in the prior art, thereby eliminating the need for a pedestal wave form. The elimination of the pedestal provides a reduced power requirement for the present invention. In addition, the present invention requires fewer components than the prior art.

Referring now to the diagram of FIG. 3, a prior art coaxial line transformer, generally designated 65, is illustrated. Transformer 65 consists of a set of coaxial lines 66–69. Each line 66–69 has an inner conductor 70–73, respectively, and an outer conductor 74–77, respectively. Lines 66–69 also have inner ferrite cores 92 and 78–80, respectively, having a high permeability and outer ferrite cores 93 and 81–83, respectively, having a lower permeability than the inner core. Lines 66–69 also have shields 94 and 84–86, respectively, to isolate them from the adjoining lines. Line 66 can be provided without inner and outer ferrite cores, 92 and 93, and shielding 94, as these are not necessary.

Inner conductors 70–73 at an input end of lines 66–69, respectively, are coupled to line 87 to receive an input signal. Outer conductors 74–77 are coupled at the input end to ground. At the output end, outer conductor 74 is coupled to ground while inner conductor 70 is coupled to the output end of outer conductor 75; the output end of inner conductor 71 is coupled to the output end of outer conductor 76; and the output end of inner conductor 72 is coupled to the output end of outer conductor 77. The output end of inner conductor 73 is then coupled to provide the amplified voltage pulse.

Inner ferrite cores 92 and 78–80 and outer ferrite cores 93 and 81–83 are utilized to effectively isolate the output end of outer conductors 74–77, respectively, from their input ends which are coupled to ground. Ferrite cores 92, 93 and 78–83 make outer conductors 74–77 appear to be longer, thereby allowing the use of shortened lines. Since transmission line 66 has both ends of its outer conductor coupled to ground it is not necessary that it be provided with these ferrite cores. The effective permeability, $\mu_{eff}$, of the ferrite cores is determinative of the delay, $\tau$, provided by the ferrite cores in the transmission lines. The delay, $\tau$, is defined by the equation;

$$\tau = \sqrt{\mu_{eff} L C} \quad (1)$$

where:
L is the distributed inductance of the transmission line;
C is the distributed capacitance of the transmission line; and
where all other variables are as defined above. Conductive covers 84–86 and 94 are provided to prevent one transmission line from interfering with another. These covers would not be required on all of the transmission lines, but could just be placed on alternating lines. A four line transformer, as illustrated here, would provide a quadrupling of the input voltage. By adding more lines to the transformer the signal may be increased proportionately by X where X is the number of transmission lines.

The input impedance, $Z_I$, of transformer 65 is defined by the equation:

$$Z_I = [\sqrt{1/\epsilon_r} \, (138) \log(d_2/d_1)](1/X) \quad (2)$$

where:
$\epsilon_r$ is the dielectric constant between the inner and outer conductors of lines 66–69;
$d_1$ is the outer diameter of the inner conductors;
$d_2$ is the inner diameter of the outer conductors; and
where all other variables are as defined above. It is desirable to have a high effective permeability, $\mu_{eff}$, and the ferrite cores are selected to provide this. The design of transformer 65 allow a high power narrow pulse to be produced.

Figure 4:
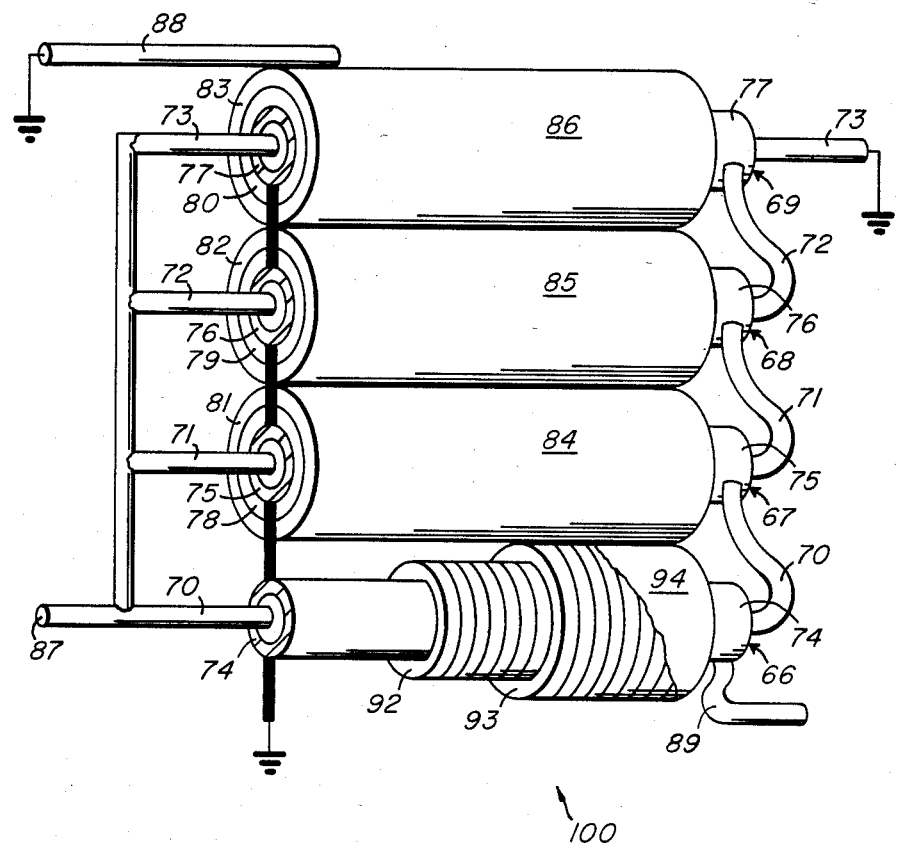
FIG. 4 is a diagram of a coaxial line inverter/transformer, a portion of which being cut away, utilized by a second embodiment of the present invention.

Referring now to the diagram of FIG. 4 a coaxial line inverter/transformer, generally designated 100, is illustrated. As is shown inverter/transformer 100 is much the same as transformer 65 with several exceptions.

Inverter/transformer 100 contains four coaxial lines 66–69 having inner conductor 70–73; outer conductor 74–77; inner ferrite core 78–80 and 92; outer ferrite cores 81–83 and 93; and conductive covers 84–86 and 94.

The first end of inner conductors 70–73 is coupled to the input line 87 which is coupled to the output of Darlington 37. The conductive covers 84–86 and 94 are coupled together and grounded along a line 88. The outer conductors 74–77 are coupled together at a first end and grounded. The second end of inner conductor 73 is coupled to ground; the second end of outer conductor 77 is coupled to the second end of inner conductor 72; the second end of outer conductor 76 is coupled to the second end of inner conductor 71; and the second end of outer conductor 75 is coupled to the second end of inner conductor 70. The second end of outer conductor 74 is coupled to provide an output along a line 89.

A portion of line 66 has been removed to more clearly illustrate the various components. It should be understood that line 66 would be much the same as line 66, FIG. 3. Line 66 illustrates inner conductor 70; outer conductor 74; inner ferrite core 92; outer ferrite ring 93 and conductive cover 94.

The configuration of inverter/transformer 100, therefore, provides the same output as that of coaxial inverter 50 and coaxial transformer 55 and can be utilized in their place.

Thus, it is apparent that there has been provided in accordance with the invention, a device and method that fully satisfies the objects, aims and advantages set forth above.

It has been shown that the present invention provides an apparatus and method that does not require the use of a pedestal thereby requiring less power. It has been shown further that the present invention requires fewer components making it more economical to produce. It has also been shown that the present invention has a faster rate of rise allowing an increased pulse repetition frequency.

While the invention has been described in conjunction with specific embodiments thereof, it is evident that many alterations, modifications and variations will be apparent to those skilled in the art in light of the foregoing description. Accordingly, it is intended to embrace all such alterations, modification, and variations in the appended claims.

We claim:

1. A pulse generating device having an input, an output, a ground, a first and second voltage supplies, said pulse generating device comprising:
   a first inductor having an input and an output, said input being coupled to said first voltage supply of said pulse generating device;
   a first diode having an anode and a cathode, said anode being coupled to said output of said first inductor;
   a first amplifier having an input, a ground line, a power line, and an output, said input being coupled to said input of said pulse generating device, said ground line being coupled to said ground, and said power line being coupled to said second voltage supply;
   a first transistor having a gate, a source and a drain, said gate being coupled to said output of said first amplifier and said drain being coupled to said second voltage supply of said pulse generating device;
   a second diode having an anode and a cathode, said anode being coupled to said source of said first transistor;
   a first resistor having a first and a second end, said first end being coupled to said cathode of said second diode and said second end being coupled to said gate of said first transistor;
   a second transistor having a gate, a source and a drain, and gate being coupled to said source of said first transistor, said source being coupled to said ground and said drain being coupled to said cathode of said first diode;
   a second inductor having an input and an output, said input being coupled to said cathode of said first diode;
   a first capacitor having an input and an output, said input being tapped into said second inductor and said output being coupled to said ground;
   a second capacitor having an input and output, said input being coupled to said output of said second inductor and said output being coupled to said ground;
   a third inductor having an input and an output, said input being coupled to said output of said second inductor;
   a third capacitor having an input and an output, said input being tapped into said third inductor;
   a fourth capacitor having a input and an output, said input being coupled to said output of said third inductor and said output being coupled to said output of said third capacitor;
   a first coaxial transmission line having an inner conductor and an outer conductor each having a first end and a second end, said first end of said inner conductor being coupled to said output of said fourth capacitor and said first and second ends of said outer conductor being coupled to said ground;
   a second coaxial transmission line having an inner conductor and an outer conductor each having a first end and second end, said first end of said inner conductor being coupled to said output of said fourth capacitor, said first end of said outer conductor being coupled to said ground and said second end of said outer conductor being coupled to said second end of said inner conductor of said first coaxial transmission line; and
   a third coaxial transmission line having an inner conductor and an outer conductor each having a first end and second end, said first end of said inner conductor being coupled to said output of said fourth capacitor, said first end of said outer conductor being coupled to said ground, said second end of said outer conductor being coupled to said second end of said inner conductor of said second coaxial transmission line and said second end of said inner conductor being coupled to said output of said pulse generating device.

2. The pulse generating device of claim 1 further comprising:
   a ferrite ring;
   a fourth coaxial transmission line having an inner conductor and an outer conductor each having a first end and a second end, said first coaxial transmission line being wrapped about said ferrite ring, said first end of said outer conductor being coupled to said ground and said first end of said inner conductor being coupled to said output of said fourth capacitor; and
   a fifth coaxial transmission line having an inner conductor and an outer conductor each having a first end and a second end, said second coaxial transmission line being wrapped about said ferrite ring, said first end of said inner conductor being coupled to said second end of said outer conductor of said fourth coaxial transmission line, said first end of said outer conductor being coupled to said second end of said inner conductor of said fourth coaxial transmission line, said second end of said outer conductor being coupled to said group and said second end of said inner conductor being coupled to said first ends of said inner conductors of said first, second and third coaxial transmission lines.

3. The pulse generating device of claim 2 further comprising a third transistor having a gate, a source and a drain, said gate being coupled to said source of said first transistor, said source being coupled to said ground and said drain being coupled to said cathode of said first diode.

4. The pulse generating devise of claim 3 further comprising:
   a fourth inductor having an input and output, said input being coupled to said output of said second inductor;
   a fifth inductor having an input and an output, said input being coupled to said output of said fourth inductor and said output being coupled to said input of said third inductor;
   a fifth capacitor having an input and an output, said input being tapped into said fourth inductor and said output being coupled to said ground;
   a sixth capacitor having an input and an output, said input being coupled to said output of said fourth inductor and said output being coupled to said ground;
   a seventh capacitor having an input and an output, said input being tapped into fifth inductor and said output being couple to said ground; and
   an eighth capacitor having an input and an output, said input being coupled to said output of said fifth inductor and said output being coupled to said ground.

5. The pulse generating device of claim 4 further comprising:
   a second amplifier having an input, a ground line, a power line and an output, said input being coupled to said input of said pulse generator device, said ground line being coupled to said ground, and said power line being coupled to said second voltage supply;

a fourth transistor having a gate, a source, and a drain, said gate being coupled to said output of said second amplifier and said drain being coupled to said second voltage supply of said pulse generating device;

a third diode having an anode and a cathode said anode being coupled to said source of said fourth transistor;

a second resistor having a first and a second end, said first end being coupled to said cathode of said third diode and said second end being coupled to said gate of said fourth transistor; and a fifth transistor having a gate, a source, and a drain, said gate being coupled to said source of said fourth transistor, said source being coupled to said ground and said drain being coupled to said cathode of said first diode.

6. The pulse generating device of claim 5 further comprising a sixth transistor having a gate, a source and a drain, said gate being coupled to said source of said fourth transistor, said source being coupled to said ground and said drain being coupled to said cathode of said diode.

7. The pulse generating device of claim 6 wherein said first, second, third, fourth, fifth and sixth transistors consist of metal oxide semiconductor field effect transistors.

8. The pulse generating device of claim 7 wherein said second and third coaxial transmission lines further consist of:

a ferrite material being disposed about said outer conductor; and a conductive shielding being disposed about said ferrite material.

9. The pulse generating device of claim 8 wherein said ferrite material of said second and third coaxial transmission line consists of:

an inner ferrite material having a permeability; and an outer ferrite material having a permeability less than the permeability of said inner ferrite material.

10. The pulse generating device of claim 1 further comprising a third transistor having a gate, a source and a drain, said gate being coupled to said source of said first transistor, said source being coupled to said ground and said drain being coupled to said cathode of said first diode.

11. The pulse generating device of claim 1 further comprising:

a fourth inductor having an input and output, said input being coupled to said output of said second inductor;

a fifth inductor having an input and an output, said input being coupled to said output of said fourth inductor and said output being coupled to said input of said third inductor;

a fifth capacitor having an input and an output, said input being tapped into said fourth inductor and said output being coupled to said ground;

a sixth capacitor having an input and an output, said input being coupled to said output of said fourth inductor and said output being coupled to said ground;

a seventh capacitor having an input and an output, said input being tapped into fifth inductor and said output being couple to said ground; and an eighth capacitor having an input and an output, said input being coupled to said output of said fifth inductor and said output being coupled to said ground.

12. The pulse generating device of claim 1 further comprising:

a second amplifier having an input, a ground line, a power line and an output, said input being coupled to said input of said pulse generator device, said ground line being coupled to said ground, and said power line being coupled to said second voltage supply;

a fourth transistor having a gate, a source, and a drain, said gate being coupled to said output of said second amplifier and said drain being coupled to said second voltage supply of said pulse generating device;

a third diode having an anode and a cathode said anode being coupled to said source of said fourth transistor;

a second resistor having a first and a second end, said first end being coupled to said cathode of said third diode and said second end being coupled to said gate of said fourth transistor; and a fifth transistor having a gate, a source, and a drain, said gate being coupled to said source of said fourth transistor, said source being coupled to said ground and said drain being coupled to said cathode of said first diode.

13. A pulse generating device having an input, an output, a ground and first and second voltage supplies, said pulse generating device comprising:

charging means for providing a voltage signal, said charging means having an input and an output, said input being coupled to said first voltage supply;

switch/driving means for providing a step signal, said switch/driving means having a first input, a second input and an output, said first input being coupled to said input of said pulse generating device, said second input being coupled to said second voltage supply and said output being coupled to said output of said charging means;

pulse forming means for providing a pulse signal, said pulse forming means having an input and an output, said input being coupled to said output of said charging means;

a first coaxial transmission line having an inner conductor and an outer conductor, each having a first end and a second end, said first end of said inner conductor being coupled to said output of said pulse forming means and said first and second ends of said outer conductor being coupled to said ground;

a second coaxial transmission line having an inner conductor and an outer conductor each having a first end and a second end, said first end of said inner conductor being coupled to said output of said pulse forming means, said first end of said outer conductor being coupled to said ground and said second end of said outer conductor being coupled to said second end of said inner conductor of said first coaxial transmission line; and a third coaxial transmission line having an inner conductor and an outer conductor each having a first end and a second end, said first end of said inner conductor being coupled to said output of said pulse forming means, said first end of said outer conductor being coupled to said ground, said second end of said outer conductor being coupled to said second end of said inner conductor of said second coaxial transmission line and said second end of said inner conductor being coupled to output of said pulse generating device.

14. The pulse generating device of claim 13 further comprising inverting means for inverting said pulse signal, said inverting means having an input and an output, said input being coupled to said output of said pulse forming means and said output being coupled to said input of said transformer means.

15. The pulse generating device of claim 14 wherein said inverting means comprises:
- a ferrite ring;
- a fourth coaxial transmission line having an inner conductor and an outer conductor each having a first end and a second end, said fourth coaxial transmission line being wrapped about said ferrite ring, said first end of said outer conductor being coupled to said ground and said first end of said inner conductor being coupled to said output of said pulse forming means;
- a fifth coaxial transmission line having an inner conductor and an outer conductor each having a first end and a second end, said fifth coaxial transmission line being wrapped about said ferrite ring, said first end of said inner conductor being coupled to said second end of said outer conductor of said fourth coaxial transmission line, said first end of said outer conductor being coupled to said second end of said inner conductor of said fourth coaxial transmission line, said second end of said inner conductor being coupled to said input of said transformer means and said second end of said outer conductor being coupled to said ground.

16. The pulse generating device of claim 13 wherein said charging means comprises:
- an inductor having an input and an output, said input being coupled to said first voltage supply of said pulse generating device; and
- a first diode having an anode and a cathode, said anode being coupled to said output of said inductor and said cathode being coupled to said input of said pulse forming means.

17. The pulse generating device of claim 13 wherein said switch/driving means comprises:
- a first amplifier having an input, a ground line, a power line and an output, said input being coupled to said input of said pulse generating device, said ground line being coupled to said ground of said pulse generating device and a power line being coupled to said second voltage supply;
- a first transistor having a gate, a source and a drain, said gate being coupled to said output of said first amplifier and said drain being coupled to said second voltage supply of said pulse generating device;
- a second diode having an anode and a cathode, said anode being coupled to said source of said first transistor;
- a first resistor having a first end and a second end, said first end being coupled to said cathode of said second diode and said second end being coupled to said gate of said first transistor; and
- a second transistor having a gate, a source and a drain, said gate being coupled to said source of said first transistor, said source being coupled to said ground and said drain being coupled to said input of said pulse forming means.

18. The pulse generating device of claim 17 further comprising a third transistor having a gate, a source and a drain, said gate being coupled to said source of said first transistor, said source being coupled to said ground and said drain being coupled to said output of said charging means.

19. The pulse generating device of claim 18 further comprising:
- a second amplifier having an input, a ground line, a power line and an output, said input being coupled to said input of said pulse generator device, said ground line being coupled to said ground, and said power line being coupled to said second voltage supply;
- a fourth transistor having a gate, a source, and a drain, said gate being coupled to said output of said second amplifier and said drain being coupled to said second voltage supply of said pulse generating device;
- a third diode having an anode and a cathode said anode being coupled to said source of said fourth transistor;
- a second resistor having a first and a second end, said first end being coupled to said cathode of said third diode and said second end being coupled to said gate of said fourth transistor; and
- a fifth transistor having a gate, a source, and a drain, said gate being coupled to said source of said fourth transistor, said source being coupled to said ground and said drain being coupled to said output of said charging means.

20. The pulse generating device of claim 19 further comprising a sixth transistor having a gate, a source and a drain, said gate being coupled to said source of said fourth transistor, said source being coupled to said ground and said drain being coupled to said cathode of said diode.

21. The pulse generating device of claim 20 wherein said first, second, third, fourth, fifth and sixth transistors consist of metal oxide semiconductor field effect transistors.

22. The pulse generating device of claim 17 wherein said pulse forming means comprises a Darlington pulse forming network having an input and an output, said input being coupled to said output of said charging means and said output being coupled to said input of said transformer means.

23. The pulse generating device of claim 13 herein said pulse forming means comprises:
- a first inductor having an input and an output, said input being coupled to said output of said charging means;
- a first capacitor having an input and an output, said input being tapped into said first inductor and said output being coupled to said ground;
- a second capacitor having an input and an output, said input being coupled to said output of said first inductor and said output being coupled to said ground;
- a second inductor having an input and an output, said input being coupled to said output of said first inductor;
- a third capacitor having an input and an output, said input being tapped into said second inductor and said output being coupled to said input of said transformer means; and
- a fourth capacitor having an input and an output, said input being coupled to said output of said second inductor and said output being coupled to said input of said transformer means.

24. The pulse generating device of claim 23 further comprising:
   a fourth inductor having an input and output, said input being coupled to said output of said second inductor;
   a fifth inductor having an input and an output, said input being coupled to said output of said fourth inductor and said output being coupled to said input of said third inductor;
   a fifth capacitor having an input and an output, said input being tapped into said fourth inductor and said output being coupled to said ground;
   a sixth capacitor having an input and an output, said input being coupled to said output of said fourth inductor and said output being coupled to said ground;
   a seventh capacitor having an input and an output, said input being tapped into fifth inductor and said output being couple to said ground; and
   an eighth capacitor having an input and an output, said input being coupled to said output of said fifth inductor and said output being coupled to said ground.

25. The pulse generating device of claim 13 wherein said second and third coaxial transmission lines consist of:
   an inner conductor;
   an outer conductor disposed about said inner conductor;
   a ferrite material being disposed about said outer conductor; and
   a shielding being disposed about said ferrite material.

26. The pulse generating device of claim 25 wherein said ferrite material of said fourth and fifth coaxial transmission line consists of:
   an inner ferrite material having a permeability; and
   an outer ferrite material have a permeability less than the permeability of said inner ferrite material.

27. A pulse generating device having an input, an output, a ground and first and second voltage supplies, said pulse generating device comprising:
   charging means for providing a voltage signal, said charging means having an input and an output, said input being coupled to said first voltage supply;
   switch/driving means for providing a step signal, said switch/driviang means having a first input, a second input and an output, said first input being coupled to said input of said pulse generating device, said second input being coupled to said second voltage supply and said output being coupled to said output of said charging means;
   pulse forming means for providing a pulse signal, said pulse forming means having an input and an output, said input being coupled to said output of said charging means;
   a first coaxial transmission line having an inner conductor and an outer conductor, each having a first end and a second end, said first end of said inner conductor being coupled to said output of said pulse forming means, said first end of said outer conductor being coupled to said ground and said second end of said outer conductor being coupled to said output of said pulse generating device;
   a second coaxial transmission line having an inner conductor and an outer conductor each having a first end and a second end, said first end of said inner conductor being coupled to said output of said pulse forming means, said first end of said outer conductor being coupled to said ground and said second end of said outer conductor being coupled to said second end of said inner conductor of said first coaxial transmission line; and
   a third coaxial transmission line having an inner conductor and an outer conductor each having a first end and a second end, said first end of said inner conductor being coupled to said output of said pulse forming means, said first end of said outer conductor being coupled to said ground, said second end of said outer conductor being coupled to said second end of said inner conductor of said second coaxial transmission line and said second end of said inner conductor being coupled to said ground.

* * * * *